(12) United States Patent
Chehade et al.

(10) Patent No.: US 12,402,276 B2
(45) Date of Patent: Aug. 26, 2025

(54) COOLING ARRANGEMENT FOR COOLING OF A RACK

(71) Applicant: OVH, Roubaix (FR)

(72) Inventors: Ali Chehade, Moncheaux (FR); Gregory Francis Louis Bauchart, Wattrelos (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 150 days.

(21) Appl. No.: 18/236,430

(22) Filed: Aug. 22, 2023

(65) Prior Publication Data
US 2024/0074104 A1 Feb. 29, 2024

(30) Foreign Application Priority Data
Aug. 25, 2022 (EP) .................................... 22306265

(51) Int. Cl.
*H05K 7/20* (2006.01)

(52) U.S. Cl.
CPC ..... *H05K 7/20272* (2013.01); *H05K 7/20263* (2013.01); *H05K 7/20736* (2013.01); *H05K 7/20781* (2013.01); *H05K 7/20836* (2013.01)

(58) Field of Classification Search
CPC ........... H05K 7/20272; H05K 7/20263; H05K 7/20736; H05K 7/20781; H05K 7/20836; H05K 7/20772
See application file for complete search history.

(56) References Cited

U.S. PATENT DOCUMENTS

| | | | |
|---|---|---|---|
| 7,486,513 B2 | 2/2009 | Hall et al. | |
| 8,051,897 B2 | 11/2011 | Campbell et al. | |
| 8,925,333 B2 | 1/2015 | Campbell et al. | |
| 9,918,413 B2 | 3/2018 | Chapel et al. | |
| 10,571,980 B2 | 2/2020 | Wang et al. | |
| 10,674,635 B2 | 6/2020 | Gao et al. | |

(Continued)

FOREIGN PATENT DOCUMENTS

| | | | |
|---|---|---|---|
| EP | 3829279 A1 | 6/2021 | |
| EP | 3917299 A1 | 12/2021 | |

OTHER PUBLICATIONS

European Search Repoirt with regard to the EP Patent Application No. 22306265.4 completed Feb. 1, 2023.

(Continued)

*Primary Examiner* — Jacob R Crum
(74) *Attorney, Agent, or Firm* — BCF LLP (57) ABSTRACT

A cooling arrangement for cooling of a rack hosting an electronic device includes a first loop including a liquid cooling unit thermally coupled to a heat-generating component of the electronic device, a primary side of a liquid-to-liquid heat exchanger fluidly connected to the liquid cooling unit; and a pump fluidly connected between the primary side and the liquid cooling unit. A second loop includes a secondary side of the liquid-to-liquid heat exchanger thermally coupled to the primary side for transfer of heat from the primary side to the secondary side. A relief line selectively fluidly connects the first and second loops and is operable in: (i) a closed state whereby the relief line does not allow cooling liquid flow therethrough, and (ii) an open state whereby the relief line fluidly connects the first and second loops.

15 Claims, 6 Drawing Sheets

(56) References Cited

U.S. PATENT DOCUMENTS

| | | |
|---|---|---|
| 11,116,114 B2 | 9/2021 | Gao |
| 2005/0247433 A1 | 11/2005 | Corrado et al. |
| 2007/0297136 A1 | 12/2007 | Konshak |
| 2017/0079166 A1* | 3/2017 | Chen .................. H05K 7/20772 |
| 2017/0105313 A1* | 4/2017 | Shedd ................ H05K 7/20309 |
| 2019/0150323 A1* | 5/2019 | Krug, Jr. ............ H05K 7/20781 |
| | | 165/173 |
| 2021/0068300 A1 | 3/2021 | Chehade et al. |
| 2021/0092874 A1 | 3/2021 | Gao |
| 2021/0302088 A1 | 9/2021 | Shao et al. |
| 2022/0217867 A1* | 7/2022 | Gao .................. H05K 7/20163 |

OTHER PUBLICATIONS

"Server Rack Cooling: Airflow, Fans and Methods", https://www.racksolutions.com/news/blog/server-cooling-fans-airflow/, Mar. 10, 2020, pdf 9 pages.

"Install In-rack or Inrow Cooling", https://www.energystar.gov/products/install_in_rack_or_in_row_cooling, Nov. 30, 2021, pdf 8 pages.

"OnRak", Airedale, https://www.airedale.com/products/it-cooling/onrak/, Nov. 30, 2021, pdf 4 pages.

"In-Rack CW", https://www.kaltra.com/products/it-cooling/in-rack-cooling, Nov. 30, 2021, pdf 6 pages.

"ChilledDoor Rack Cooling System", ChilledDoor Rack Cooling System, https://www.motivaircorp.com/products/chilleddoor/, Nov. 30, 2021, pdf 1 page.

* cited by examiner

COOLING ARRANGEMENT FOR COOLING OF A RACK

CROSS REFERENCE

The present application claims priority to EP Application No. 22306265.4, filed Aug. 25, 2022 entitled "Cooling Arrangement for Cooling of a Rack", the entirety of which is incorporated herein by reference.

FIELD

The present technology relates to cooling of electronic equipment stored in racks.

BACKGROUND

Server racks are used for storing servers and other supporting electronic equipment (e.g., networking equipment, power equipment, etc.) during operation thereof. For instance, data centers often contain thousands of server racks supporting thousands or even tens of thousands of servers. The electronic devices stored in the racks consume large amounts of electric power and generate significant amounts of heat. As such, cooling considerations are important for these racks. Namely, some electronic components, such as processors, are sensitive to heat and their performance could rapidly degrade if cooling thereof is inadequate.

To prevent overheating, in some cases, liquid cooling units such as waterblocks are mounted on heat-generating components of the electronic devices to absorb heat from these components. Notably, a cooling liquid (e.g., water) is circulated through the liquid cooling units to absorb heat therefrom. Upon being discharged from the liquid cooling units, the cooling liquid is routed to a cooling apparatus to cool the cooling liquid to a temperature adequate for absorbing heat from the heat-generating components, at which point the cooling liquid is again circulated through the liquid cooling units. It is also known to combine such liquid cooling units with air cooling solutions. In particular, some racks are provided with air-to-liquid heat exchangers through which air flow is promoted via fans. The air is cooled by the air-to-liquid heat exchangers such that the air discharged from the racks is not excessively hot and therefore does not significantly increase the operating temperature of the surrounding environment (e.g., the data center).

However, in a large computing facility housing a multitude of racks, providing both liquid cooling and air cooling to each rack can require a significant infrastructure (e.g., extensive piping) and therefore important material and labor costs.

There is thus a desire to provide a cooling arrangement for a rack that at least partly addresses these drawbacks.

SUMMARY

It is an object of the present technology to ameliorate at least some of the inconveniences present in the prior art.

According to an aspect of the present technology, there is provided a cooling arrangement for cooling of a rack hosting at least one electronic device. The cooling arrangement comprises: a first loop comprising: at least one liquid cooling unit thermally coupled to a heat-generating component of the at least one electronic device for cooling thereof, the at least one liquid cooling unit defining a liquid channel adapted to receive a cooling liquid for transferring heat from the heat-generating component to the cooling liquid flowing in the liquid channel, a primary side of a liquid-to-liquid heat exchanger, the primary side being fluidly connected to the liquid channel of the at least one liquid cooling unit, and a pump fluidly connected between the primary side of the liquid-to-liquid heat exchanger and the at least one liquid cooling unit, the pump being adapted for causing the cooling liquid to flow within the first loop; a second loop comprising: a secondary side of the liquid-to-liquid heat exchanger, the secondary side being thermally coupled to the primary side to transfer heat from the primary side to the secondary side in response to a temperature of the primary side being greater than a temperature of the secondary side; and a relief line selectively fluidly connecting the first loop to the second loop, the relief line being operable in: (i) a closed state whereby the relief line does not allow cooling liquid flow therethrough between the first loop and the second loop, and (ii) an open state whereby the relief line fluidly connects the first loop to the second loop to allow the cooling liquid from the first loop to flow into the second loop, the relief line switching between the closed state and the open state based on at least one operational parameter of the cooling liquid flowing in the first loop.

In some embodiments, the at least one operational parameter includes at least one of a pressure and a temperature of the cooling liquid flowing in the first loop.

In some embodiments, the at least one operational parameter includes the pressure of the cooling liquid flowing in the first loop; and the relief line switches from the closed state to the open state in response to the pressure being greater than a predetermined pressure threshold.

In some embodiments, the at least one operational parameter includes the temperature of the cooling liquid contained in the first loop; and the relief line switches from the closed state to the open state in response to the temperature being greater than a predetermined temperature threshold.

In some embodiments, the relief line comprises a safety valve configured to open and close based on the at least one operational parameter.

In some embodiments, the relief line further comprises a solenoid valve.

In some embodiments, the relief line fluidly connects an inlet of the primary side of the liquid-to-liquid heat exchanger to an inlet or outlet of the secondary side of the liquid-to-liquid heat exchanger.

In some embodiments, the cooling arrangement further comprises a secondary relief line fluidly connected to the first loop, the secondary relief line comprising an expansion valve or tank for regulating a temperature of the cooling liquid contained in the first loop.

In some embodiments, the cooling arrangement further comprises a feed line that fluidly connects the first loop to a cooling liquid source in order to allow cooling liquid to flow from the cooling liquid source to the first loop.

In some embodiments, the feed line comprises a non-return valve configured for preventing cooling liquid from the first loop from flowing back in the second loop.

In some embodiments, the feed line comprises one of a solenoid valve and a pressure regulating valve.

In some embodiments, the cooling liquid source is the second loop such that the feed line fluidly connects the first loop to the second loop.

In some embodiments, the feed line comprises a filter for filtering the cooling liquid incoming from the second loop.

In some embodiments, the feed line fluidly connects an inlet of the primary side of the liquid-to-liquid heat exchanger to an inlet of the secondary side of the liquid-to-liquid heat exchanger.

In some embodiments, a rack comprises: a frame defining a housing section for receiving at least one electronic device; at least one fan configured for providing forced air cooling to the at least one electronic device; and the cooling arrangement for cooling of the at least one electronic device.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", "primary", "secondary", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

Figure 1:
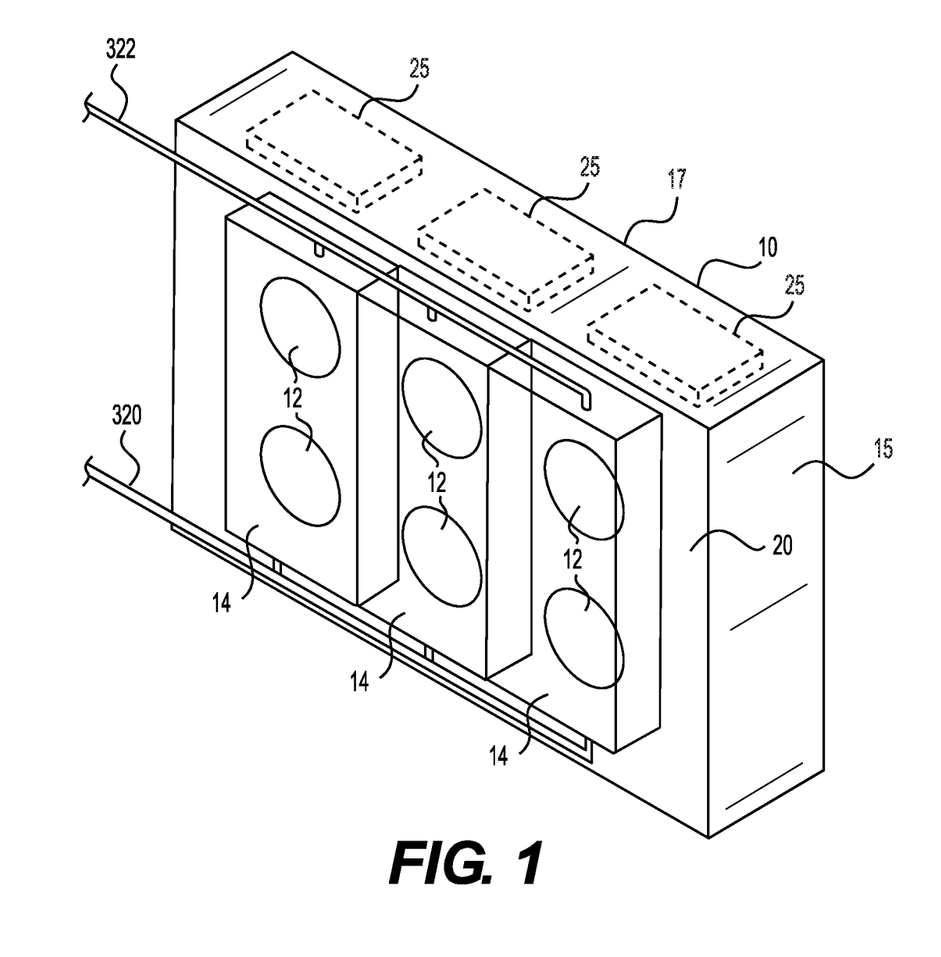
FIG. 1 is a perspective view taken from a front of a server rack.

With reference to FIG. 1, a rack 10 has a frame 15 which defines a plurality of internal housing sections (not shown) for hosting a number of electronic devices 25 (three of which are shown in dashed lines in FIG. 1). In particular, in this embodiment, the electronic devices 25 are inserted into the housing sections via a front side 17 of the rack 10 (opposite a rear side 20 of the rack 10). In this embodiment, the internal housing sections includes three housing sections spaced laterally from one another. Each of the three electronic devices 25 illustrated in FIG. 1 is disposed in a corresponding one of the housing sections. It is contemplated that, in other embodiments, the frame 15 could define a single housing section such that all of the electronic devices 25 stored in the rack 10 are disposed in the same housing section.

The electronic devices stored in the rack 10 may be computer systems such as servers and/or other electronic devices that support the servers' functionality (e.g., network switches, power distribution units, etc.). Notably, the rack 10 may be used in a data center where a multitude of such racks can be stored. The rack may thus be referred to as a server rack 10, however it is understood that the rack 10 may be used to store servers and other electronic devices associated with the servers' functionality.

In this embodiment, the rack 10 has a plurality of fans 12 (e.g., six fans) and a plurality of air-to-liquid heat exchangers 14 that collaborate together to ventilate the rack 10 while limiting the temperature of the surroundings of the rack 10. Notably, the fans 12 expel heated air from the rack 10 in a direction of the three air-to-liquid heat exchangers 14 (shown in transparency in FIG. 1 in order to render the fans 12 visible) which are mounted to the frame 15 of the rack 10 on the rear side 20 thereof. A cooling liquid is circulated through the air-to-liquid heat exchangers 14 to absorb heat from the air forced through the rack 10 by the fans 12. It is contemplated that, in some embodiments, the fans 12 could be omitted (e.g., force air cooling could be omitted or provided by fans external to the rack 10). In this example, the cooling liquid is water, however any suitable cooling liquid could be used (e.g., a refrigerant). The term "cooling liquid" also encompasses such fluids that may transition between liquid and gaseous states during operation (i.e., a two-phase flow). The air-to-liquid heat exchangers 14 receive cold cooling liquid from a cold supply line 320 and return heated liquid to a warm liquid line 322. Air flowing through the air-to-liquid heat exchangers 14 is thus cooled down to allow maintaining an ambient temperature of the data center to an adequate level.

It is contemplated that, in some embodiments, the air-to-liquid heat exchangers 14 could be omitted.

Figure 2:
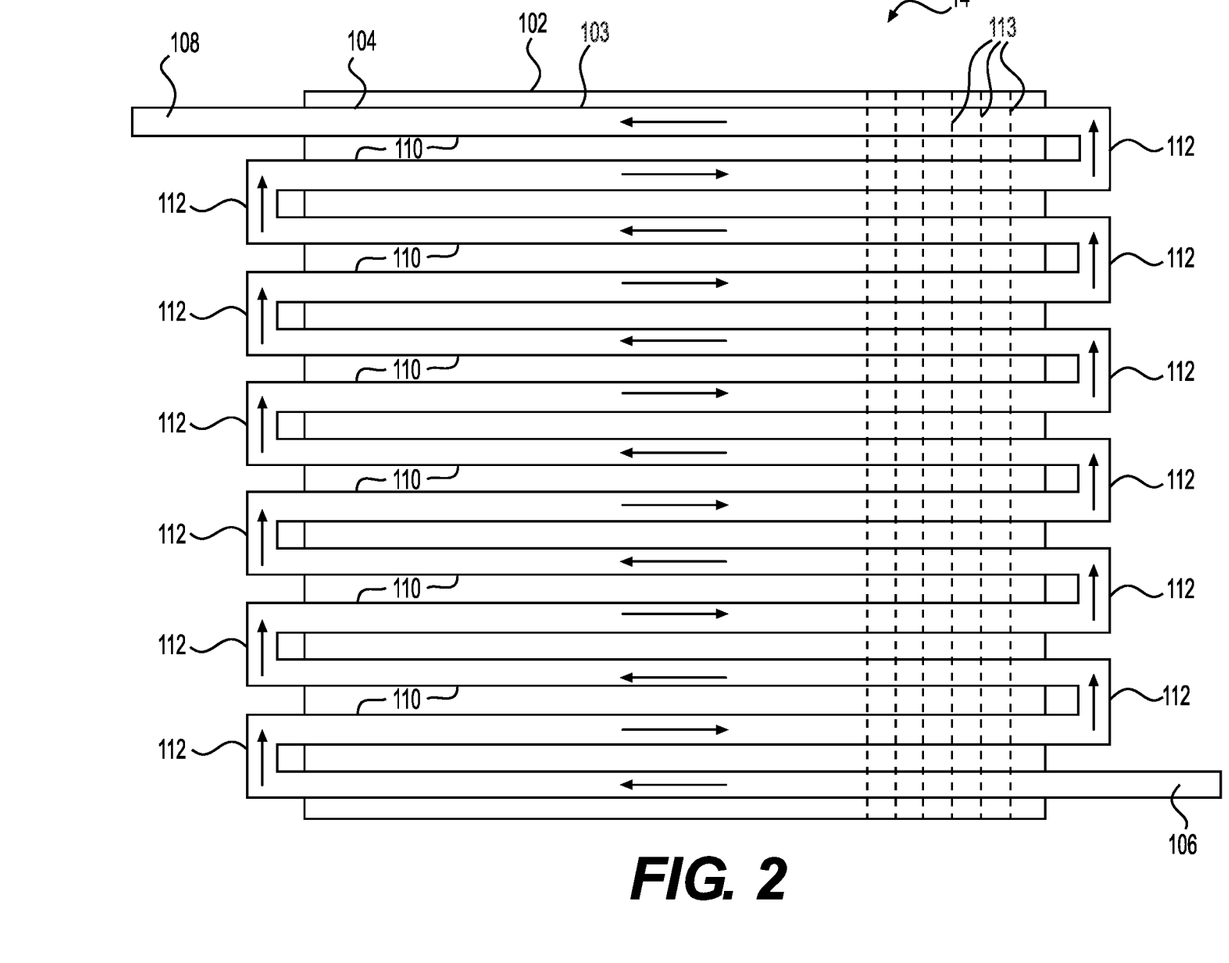
FIG. 2 is a diagram of an air-to-liquid heat exchanger of the server rack of FIG. 1.

The air-to-liquid heat exchangers 14 will now be described in greater detail with reference to FIG. 2 which illustrates an exemplary one of the air-to-liquid heat exchangers 14. The air-to-liquid heat exchanger 14 comprises a frame 102 and a cooling coil 103 defining a continuous internal conduit 104. The cooling coil 103 has an inlet 106 disposed at one end of the cooling coil 103 and an outlet 108 at an opposite end of the cooling coil 103. The inlet 106 is connectable to a supply line such as the cold liquid line 16 for receiving a cold cooling liquid. The outlet 108 is connectable to a return line such as the hot liquid line 18 for returning the cooling liquid which has been heated by absorbing heat from air flowing through the frame 102. The cooling coil 103 forms a plurality of interconnected parallel sections 110 that extend within the frame 102. The inlet 106 is connected to a first interconnected parallel section 110. Each interconnected parallel section 110, except a last one, is connected to a next interconnected parallel section 110 via a generally U-shaped section 112 of the continuous internal conduit 104. The last interconnected parallel section 110 is connected to the outlet 108. Cooling liquid received at the inlet 106 flows within the continuous internal conduit 104 in the direction shown by the various arrows until it reaches the outlet 108. Heat from the air flowing through the frame 102 of the air-to-liquid heat exchanger 14 is absorbed at least in part by the cooling liquid flowing through the continuous internal conduit 104.

In this embodiment, the air-to-liquid heat exchanger 14 is mounted on the server rack 10 by hinges (not shown) so that the air-to-liquid heat exchanger 14 may be pivoted about a hinge axis and thereby moved aside, as when opening a door, to provide access to components concealed thereby (e.g., the fans 12). It is contemplated that the air-to-liquid heat exchanger 14 could alternatively not be hinged and instead simply be fixed to the rack 10.

The frame 102 occupies most of the overall width of air-to-liquid heat exchanger 14, as only the generally U-shaped section 112 of the continuous internal conduit 104 protrudes on each side of the frame 102. Consequently, the air-to-liquid heat exchanger 14 offers a broad surface that may be traversed by a flow of air expelled from the server rack 10. Moreover, the air-to-liquid heat exchanger 14 has a plurality of fins 113 (some of which are illustrated in dashed lines in FIG. 2) connected to the cooling coil 103. The fins 113 are spaced from each other to allow air flow therebetween. The fins 113 are thermally connected to the cooling coil 103 in order to provide a greater surface area for heat exchange between the cooling coil 103 and the air flowing between the fins 113.

Alternative implementations of the air-to-liquid heat exchangers 14 are contemplated.

While the air flow through the rack 10 promoted by the fans 12 dissipates some of the heat generated by the electronic devices 25 stored in the rack 10, a plurality of liquid cooling units 250 (FIGS. 3, 4) is also provided to more locally dissipate heat generated by the electronic devices 25. In particular, as shown in FIG. 4, each liquid cooling unit 250 is mounted to a heat-generating electronic component 252 of one of the electronic devices 25, and a cooling liquid, namely the same type of cooling liquid as that used by the air-to-liquid heat exchangers 14, is made to flow through the liquid cooling unit 250 to absorb heat from the heat-generating electronic component 252. Such liquid cooling units 250 are also commonly referred to as "waterblocks" or "cold plates". The heat-generating electronic component 252 may be a processor (such as a central processing unit (CPU) or a graphics processing unit (GPU)), part of a memory device such as part of a random-accessory memory device or a hard disk drive, or any other suitable heat-generating electronic component that could benefit from cooling. An exemplary one of the liquid cooling units 250 will now be described in greater detail with reference to FIG. 4.

The liquid cooling unit 250 has a thermal transfer surface 254 in thermal contact with the heat-generating electronic component 252 in order to thermally couple the liquid cooling unit 250 to the heat-generating electronic component 252. It is to be understood that thermal contact can be established directly between the thermal transfer surface 254 and the heat-generating electronic component 252 or through an intermediary conducting element such as thermal paste which can be applied between the thermal transfer surface 254 and the heat-generating electronic component 252 to enhance thermal transfer therebetween. In this embodiment, the liquid cooling unit 250 has a base portion 256 and a cover portion 258 that are fastened to each other (e.g., welded) to define a liquid channel 260 (shown schematically in FIG. 4) for receiving the cooling liquid therein. In particular, the liquid cooling unit 250 has an inlet conduit 262 connected to an inlet 264 of the liquid channel 260, and an outlet conduit 266 connected to an outlet 268 of the liquid channel 260. The inlet 264 receives cooled cooling liquid via the inlet conduit 262 and, after the cooling liquid absorbs heat by flowing through the liquid channel 260, the outlet 268 discharges heated cooling liquid through the outlet conduit 266. In this example, the inlet 264 and the outlet 268 are defined by the cover portion 258 of the liquid cooling unit 250. It is contemplated that the liquid cooling unit 250 could be configured differently in other embodiments.

Figure 3:
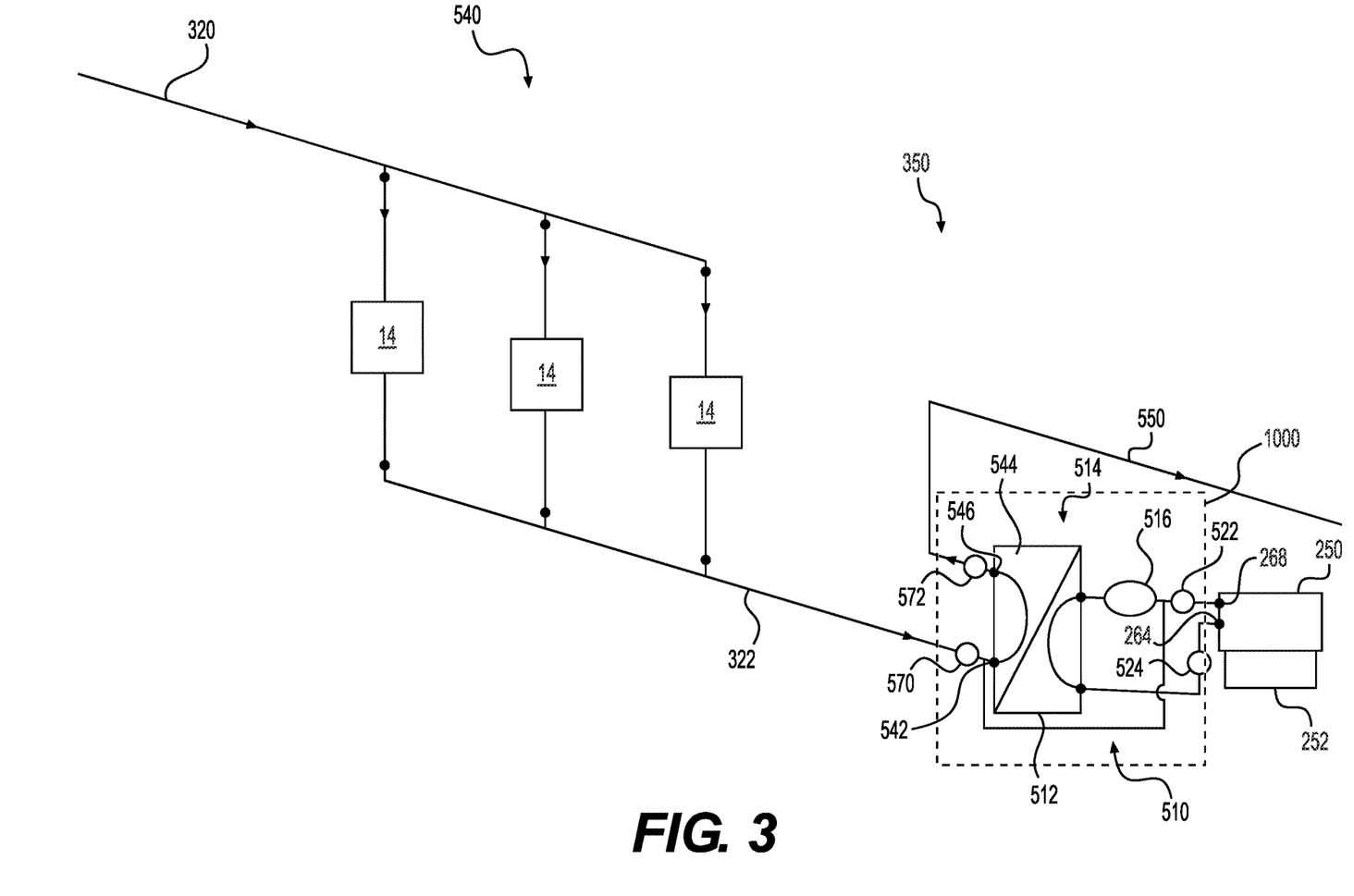
FIG. 3 is a diagram of a cooling arrangement of the server rack of FIG. 1 in accordance with an embodiment of the present technology.
Figure 4:
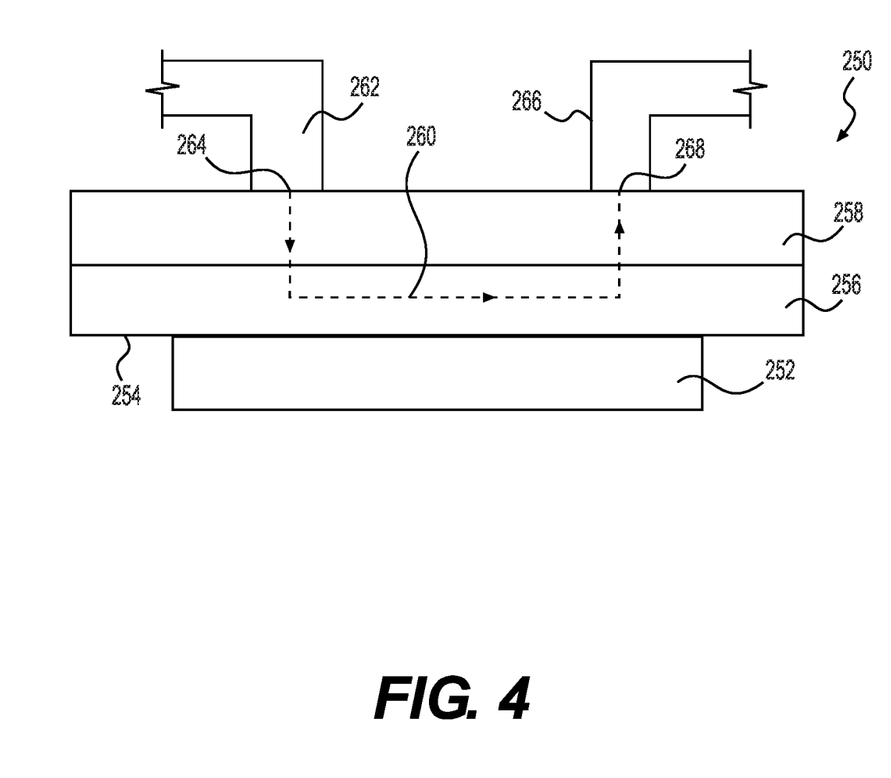
FIG. 4 is a side elevation view of a liquid cooling unit of a first loop of the cooling arrangement of FIG. 3.

With reference to FIG. 3, the air-to-liquid heat exchangers 14 and the liquid cooling units 250 form part of a cooling arrangement 350 provided to cool the rack 10. Notably, the liquid cooling units 250 (a single one of which is illustrated in FIG. 3 for simplicity) form part of a first cooling loop 510 of the cooling arrangement 350 while the air-to-liquid heat exchangers 14 form part of a second cooling loop 540 of the cooling arrangement 350. As will be described in greater detail below, the cooling loops 510, 540 are in heat exchange with each other which can be helpful to cool the cooling liquid flowing within one of the cooling loops 510, 540 and minimizing the amount of cooling liquid feed lines external to the rack 10. In turn, this can simplify installation and reduce expenses associated with the cooling arrangement 350 in comparison with conventional cooling systems for server racks.

As shown in FIG. 3, the cooling arrangement 350 also includes a liquid-to-liquid heat exchanger 514 that allows the cooling liquids flowing through the first loop 510 and the second loop 540 to be in thermal exchange with each other. In particular, a primary side 512 of the liquid-to-liquid heat exchanger 514 forms part of the first loop 510 while a secondary side 544 of the liquid-to-liquid heat exchanger 514 forms part of the second loop 540. Notably, the primary side 512 of the liquid-to-liquid heat exchanger 514 is fluidly connected to the liquid channels 260 of the liquid cooling units 250 such that the cooling liquid that flows through the liquid cooling units 250 is routed through the primary side 512 of the liquid-to-liquid heat exchanger 514. In this embodiment, the liquid-to-liquid heat exchanger 514 is a plate heat exchanger 514 having a plurality of plates (not shown) to transfer heat between the cooling liquid flowing through the first loop 510 and the cooling liquid flowing through the second loop 540.

It is contemplated that, in some embodiments, the second loop 540 could instead just include the second side 544 of the liquid-to-liquid heat exchanger 514 (e.g., in cases where the air-to-liquid heat exchangers 14 are omitted).

In this embodiment, the first loop 510 also includes a pump 516 that is fluidly connected between the liquid cooling units 250 and the primary side 512 of the liquid-to-liquid heat exchanger 514. The pump 516 maintains the cooling liquid flowing within the first loop 510. In particular, the pump 516 causes the cooling liquid in the first loop 510 to flow from the outlets 268 of the liquid cooling units 250 to an inlet 518 of the primary side 512 of the liquid-to-liquid heat exchanger 514, and from an outlet 520 of the primary side 512 of the liquid-to-liquid heat exchanger 514 to the inlets 264 of the liquid cooling units 250. More specifically, with reference to FIG. 5, in this embodiment, the first loop 510 has a manifold 526 that includes a multi-port inlet 528 having a plurality of ports 530 connectable to the outlets 268 of the liquid cooling units 250 and one outlet port 532 connectable to the pump 516 for delivering cooling liquid from the liquid cooling units 250 (and thus having been heated thereby) to the primary side 512 of the liquid-to-liquid heat exchanger 514 via the pump 516. The manifold 526 also includes a multi-port outlet 534 having an inlet port 536 that receives cooling liquid from the outlet 520 of the liquid-to-liquid heat exchanger 514 and having been cooled thereby. The multi-port outlet 534 also includes a plurality of outlet ports 538 that are fluidly connected to the inlets 260 of the liquid cooling units 250 to deliver cooled cooling liquid thereto.

Figure 5:
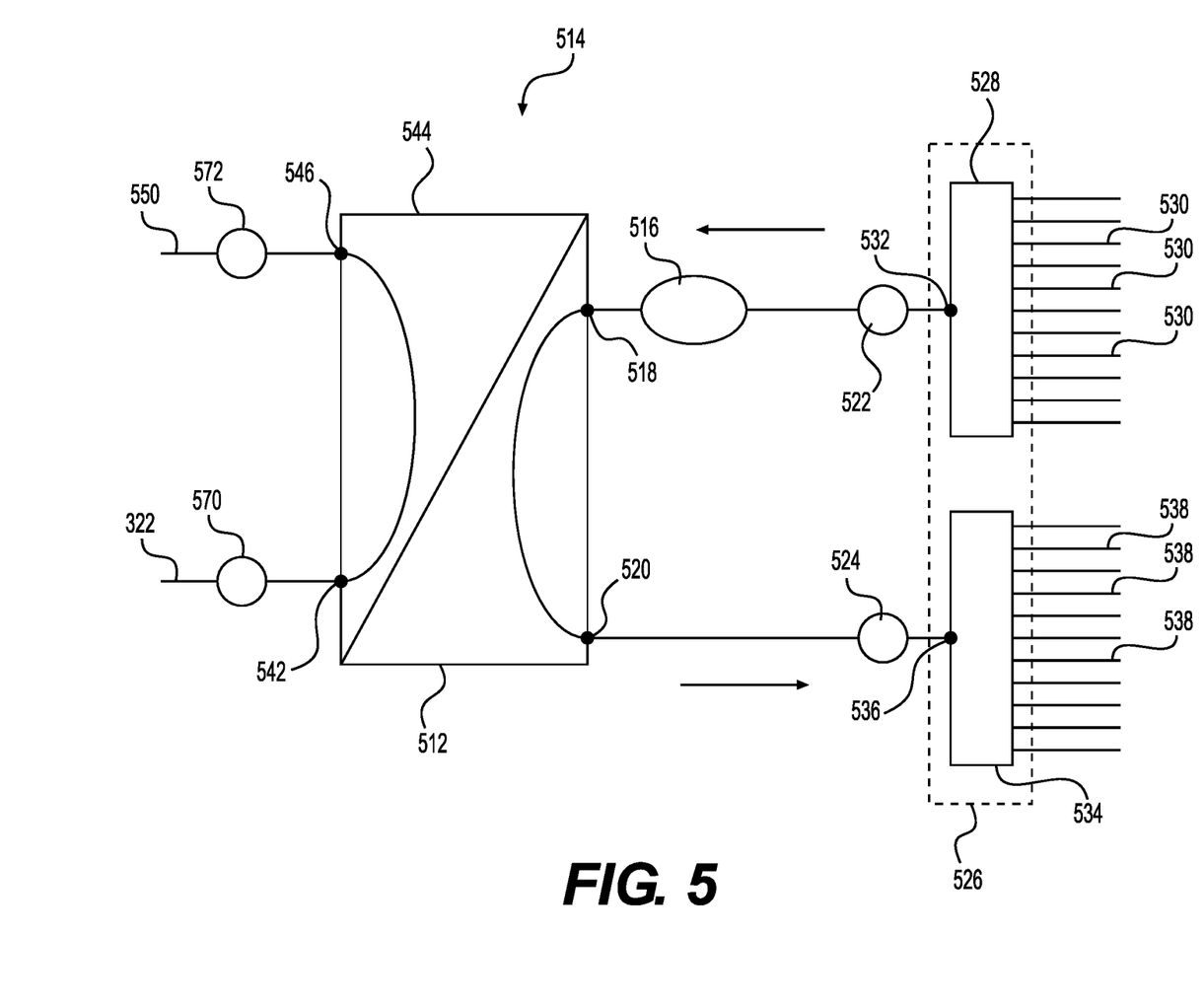
FIG. 5 is a detailed view of part of the cooling arrangement of FIG. 3.

In this embodiment, the first loop 510 may be taken out of service by closing valves 522 and 524 (FIG. 5). The valves 522, 524 may be omitted in other embodiments.

As will be described in more detail below, as shown in FIG. 3, in this embodiment, a feed line 22 is provided to fluidly connect the first loop 510 to a cooling liquid source in order to allow cooling liquid to flow from the cooling liquid source to the first loop 510. An implementation of the feed line 22 is described in greater detail further below.

With reference to FIG. 3, in the second loop 540, the air-to-liquid heat exchangers 14 are fed with cold cooling liquid from an external source (not shown) via the cold supply line 320 to reduce a temperature of the air expelled from the rack 10 by the fans 12. In particular, the cold supply line 320 is fluidly connected to the inlet 106 of the cooling coil 103 of each of the air-to-liquid heat exchangers 14. As the cooling liquid flows within the cooling coils 103 of the air-to-liquid heat exchangers 14, a temperature of the cooling liquid is modestly increased by the transfer of thermal energy from the air that flows through the air-to-liquid heat exchangers 14 to the cooling liquid flowing within the cooling coils 103. As such, the cooling liquid discharged by the air-to-liquid heat exchangers 14 may be characterized as being 'warm'. In contrast, the cooling liquid flowing out of the liquid cooling units 250 has a considerably higher temperature and may thus be characterized as being 'hot'.

After being discharged from the outlets 108 of the air-to-liquid heat exchangers 14, the warm cooling liquid flows, via the warm liquid line 322, into an inlet 542 of the secondary side 544 of the liquid-to-liquid heat exchanger 514. Since the temperature of the warm cooling liquid fed to the secondary side 544 by the air-to-liquid heat exchangers 14 is lower than the temperature of the hot cooling liquid fed to the primary side 512 by the liquid cooling units 250, the warm cooling liquid flowing through the secondary side 544 of the liquid-to-liquid heat exchanger 514 absorbs heat from the hot cooling liquid flowing through the primary side 512 of the liquid-to-liquid heat exchanger 514. Therefore, the cooling liquid that is discharged from an outlet 546 of the secondary side 544 of the liquid-to-liquid heat exchanger 514 is heated to a temperature greater than the warm cooling liquid that is fed to the inlet 542 of the secondary side 544. Thus, as will be appreciated, the primary side 512 and the secondary side 544 of the liquid-to-liquid heat exchanger 514 are thermally coupled for transfer of heat from the primary side 512 to the secondary side 544.

The heated cooling liquid discharged from the outlet 546 of the secondary side 544 of the liquid-to-liquid heat exchanger 514 flows through a hot return line 550 in order to leave the second loop 540. The second loop 540 may be taken out of service by closing valves 570 and 572 (FIG. 3). The valve 570, 572 may be omitted in other embodiments. The hot return line 550 is fluidly connected to the external source of cooling liquid that feeds the cold supply line 320 of the second loop 540. The external source may include for instance cooling equipment that cools the cooling liquid. For example, the external source could be a dry cooler which is installed on the outside of a data center. As such, the heated cooling liquid in the second loop 540 is continuously replaced with cold cooling liquid.

According to one example, the cooling liquid may be received in the cold supply line 320 of the second loop 540 at 30° C. The cooling liquid is then heated by air-to-liquid heat exchangers 14 and is discharged to the warm liquid line 322 at a temperature of 34.5° C. In the same example, in the first loop 510, cooling liquid is supplied by the primary side 512 of the liquid-to-liquid heat exchanger 514 to the liquid cooling units 250 at 40° C. After flowing through the liquid cooling units 250, the cooling liquid is received at a temperature of 50° C. when returning to the primary side 512. The thermal exchange between the primary side 512 and the secondary side 544 of the liquid-to-liquid heat exchanger 514 heats the cooling liquid in the second loop 540 such that it is received by the hot return line 550 at a temperature of 45° C. Simultaneously, in the first loop 510, the cooling liquid in the secondary side 544 of the liquid-to-liquid heat exchanger 514 is cooled and discharged at a temperature of 40° C. at the outlet 520 of the primary side 512 to be fed again to the liquid cooling units 250.

It may be noted that, in cold climates, the high temperature of the cooling liquid flowing in the hot return line 550 could allow the cooling liquid in the hot return line 550 to be diverted for heat recovery purposes (i.e., to warm up particular infrastructures of a data center).

The coupling module 1000 implementing the thermal connection and, as will be described in more detail below, a selective fluidic connection between the second loop 540 and the first loop 510 will now be described with reference to FIG. 6. The coupling module 1000 is connected to the rack 10 and is dimensioned to be relatively compact. Notably, in this embodiment, the coupling module 1000 includes a subframe 504 that is connectable to the frame 15 of the rack 10 and to which the other components of the coupling module 1000 are connected. For instance, the subframe 504 may be connected to a lateral end of the rack 10. As will be described in greater below, the coupling module 1000 may minimize the amount of piping lines external to the rack 10 that are needed to implement the first and second loops 510, 540.

As can be seen, the coupling module 1000 comprises some components of both the first loop 510 and the second loop 540, namely including the liquid-to-liquid heat exchanger 514, the pump 516 and the valves 522, 524, 570, 572 mentioned above. The coupling module 1000 also includes part of a conduit 610 that routes cooling liquid from the liquid cooling units 250 to the pump 516. In this embodiment, a relief line 80 is fluidly connected to the first loop 510 at the conduit 610. In this example, the relief line 80 is fluidly connected to the conduit 610 at a location upstream from the pump 516. The relief line 80 includes an expansion member 90 for regulating a temperature and/or pressure of the cooling liquid in the first loop 510. In this embodiment, the expansion member 90 is an expansion valve. Notably, the expansion valve 90 can be actuated between a closed state and an open state based on the temperature and/or pressure of the cooling liquid within the first loop 510. The expansion valve 90 may be, for example, a thermostatic expansion valve for conducting cooling liquid from the first loop 510 toward a condenser (not shown) when the expansion valve 90 is in the open state. In other embodiments, the expansion member 90 could be an expansion tank have a diaphragm that accommodates pressure variation.

It is contemplated that the relief line 80 could be omitted in some embodiments.

As mentioned above, in this embodiment, the feed line 22 fluidly connects the first loop 510 to a cooling liquid source. Notably, this can help compensate for any cooling liquid losses in the first loop 510, such as losses due to leaks at the various connections along the first loop 510. With reference to FIG. 6, in this embodiment, the cooling liquid source is the second loop 540 and, as such, the feed line 22 fluidly connects the first loop 510 to the second loop 540 to allow cooling liquid from the second loop 540 into the first loop 510. In particular, in this example, the feed line 22 extends from the warm liquid line 322 (part of which is comprised by the coupling module 1000) at a location upstream from the inlet 542 of the secondary side 544 of the liquid-to-liquid heat exchanger 514 to the conduit 610 at a location upstream from the pump 516.

The fluid connection between the first loop 510 and the second loop 540 established by the feed line 22 can reduce the amount of piping that has to be routed to the rack 10 externally therefrom as would be the case for example if the cooling liquid source that the feed line 22 connected to the first loop 510 was external to the rack 10. For instance, the deployment of additional piping would be particularly significant in a data center that stores a multitude of server racks since each rack would require piping to be routed thereto to fluidly connect the external cooling liquid source to the first loop of each rack. As will be appreciated, a significant amount of labor and costs can therefore be spared by minimizing the amount of piping that is routed to the racks of the data center.

Nevertheless, it is contemplated that, in other embodiments, the cooling liquid source that provides cooling liquid to the feed line 22 may be an external source instead of the second loop 540. For example, in some embodiments, the cooling liquid source could be a tank of cooling liquid that is external to the rack 10 (e.g., a tank that provides cooling liquid to the first loops associated with respective ones of the racks of a data center). In some cases, the tank could be fed by a water purifying system in order to provide water that is as free as possible of impurities.

Figure 6:
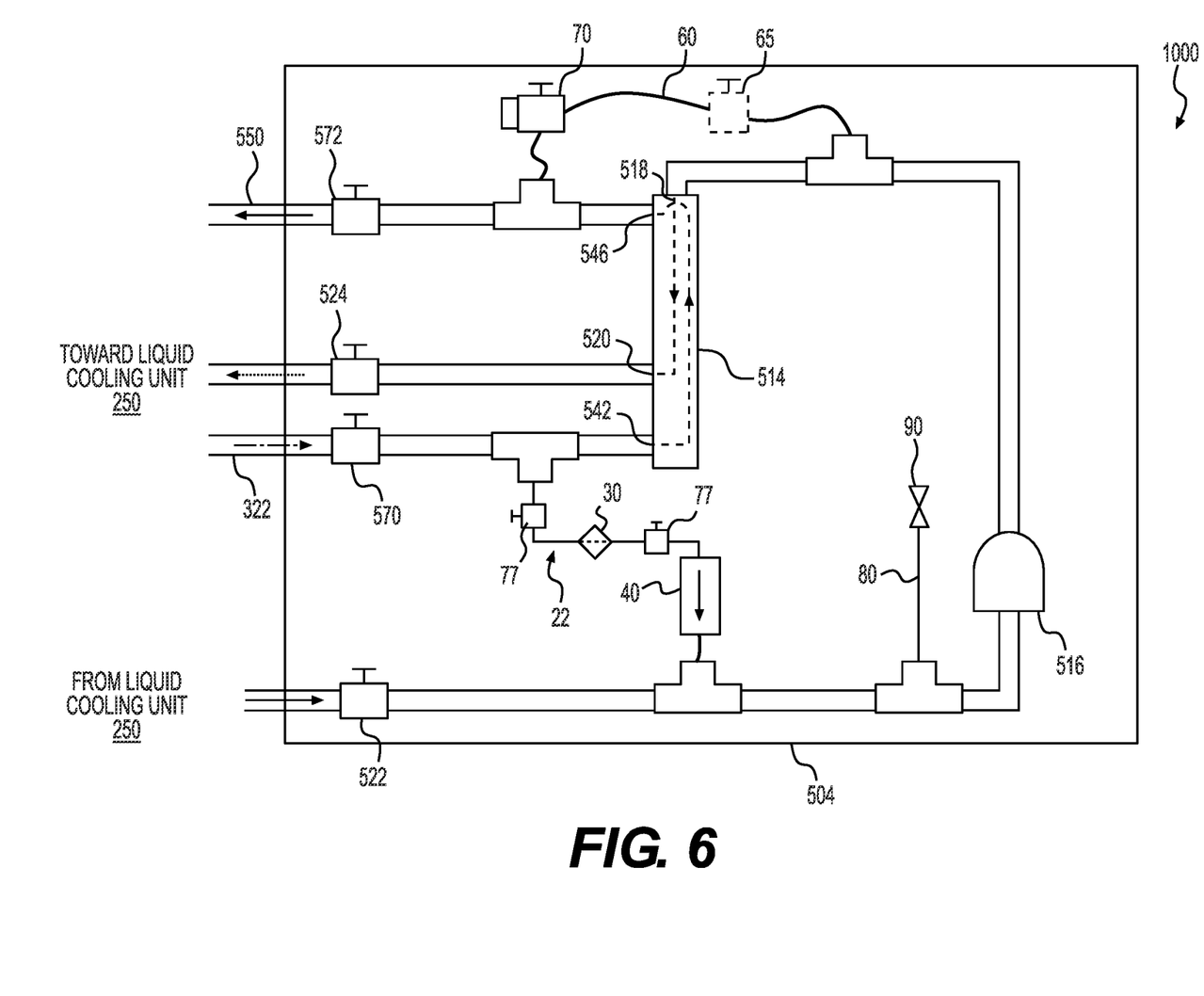
FIG. 6 is a diagram of a coupling module providing thermal connection between the first loop and the second loop of FIG. 3.

As shown in FIG. 6, in this embodiment, the feed line 22 comprises a non-return valve 40 preventing cooling liquid from the first loop 510 from flowing back into the second loop 540 through the feed line 22. In other words, the cooling liquid flows through the non-return valve 40 in a single direction, namely from the second loop 540 to the first loop 510. In this embodiment, the feed line 22 further comprises a filter 30 filtering the impurities out of the cooling fluid incoming from the second loop 540 before it enters the first loop 510. Notably, it is expected that the cooling liquid in the second loop 540 may contain a greater degree of impurities than the first loop 510. Moreover, the first loop 510 may be more sensitive to the presence of impurities such as calcium deposits for example due to the small size of the liquid channels 260 of the liquid cooling units 250.

In some embodiments, the feed line 22 could also include one or more valves 77 such as a solenoid valve, a pressure regulating valve and/or a check valve. The valves 77 could be omitted in other embodiments.

With continued reference to FIG. 6, the coupling module 1000 includes another relief line 60 that selectively fluidly connects the first loop 510 to the second loop 540. For the sake of clarity, the relief line 60 will be referred to as a "primary" relief line 60, and the relief line 80 will be referred to as a "secondary" relief line 80. The primary relief line 60 is provided to relieve the excessive pressure and/or temperature of the cooling liquid in the first loop 510 that the secondary relief line 80 cannot (i.e., beyond a maximum relieving pressure or temperature). Notably, the expansion valve 90 of the secondary relief line 80 has an upper limit of pressure and/or temperature of the cooling liquid that it can relieve, and the primary relief line 60 is configured to intervene in case the pressure and/or temperature of the cooling liquid exceeds the upper limit of the expansion valve 90. Alternatively, in embodiments in which the secondary relief line 80 is omitted, the primary relief line 60 is the single relief line provided.

The primary relief line 60 is operable in a closed state and in an open state. In the closed state, the primary relief line 60 prevents cooling liquid from flowing therethrough between the first loop 510 and the second loop 540. In other words, in the closed state, the primary relief line 60 does not allow cooling liquid therethrough. Conversely, in the open state, the primary relief line 60 fluidly connects the first loop 510 to the second loop 540 to allow the cooling liquid from the first loop 510 to flow into the second loop 540. As will be described in more detail below, the primary relief line 60 is switched between the closed state and the open state based on one or more operational parameters of the cooling liquid flowing in the first loop 510.

As can be seen in FIG. 6, in this embodiment, the primary relief line 60 extends from a point along the first loop 510 upstream from the primary side 512 of the liquid-to-liquid heat exchanger 514 to a point along the second loop 540 downstream from the secondary side 544 of the liquid-to-liquid heat exchanger 514. In other words, the primary relief line 60 fluidly connects the inlet 518 of the primary side 512 of the liquid-to-liquid heat exchanger 514 to the outlet 546 of the secondary side 544 of the liquid-to-liquid heat exchanger 514. Thus, excessive pressure in the first loop 510 will be discharged into the second loop 540 via the primary relief line 60. The diameter of the primary relief line 60 is smaller than the diameter of the main line of the first loop 510. As such, the cooling liquid will still circulate within the first loop 510 while the excessive pressure is discharged via the primary relief line 60.

It is contemplated that, in other embodiments, the primary relief line 60 fluidly connects the inlet 518 of the primary side 512 of the liquid-to-liquid heat exchanger 514 to the inlet 542 of the secondary side 544 of the liquid-to-liquid heat exchanger 514.

In this embodiment, the primary relief line 60 comprises a safety valve 70 that is selectively actuated to place the primary relief line 60 in the open state or in the closed state. In particular, the safety valve 70 is selectively opened or closed to place the primary relief line 60 in the open state or the closed state respectively. More specifically, when the safety valve 70 is closed, the safety valve 70 blocks cooling liquid from flowing therethrough, thereby impeding the cooling liquid from flowing from the first loop 510 to the second loop 540 via the primary relief line 60. When the safety valve 70 is open, the safety valve 70 fluidly connects the first loop 510 to the second loop 540 to allow the cooling liquid from the first loop 510 to flow through the safety valve 70 into the second loop 540.

The safety valve 70 is actuated (i.e., opened or closed) based on one or more operational parameters of the cooling liquid flowing in the first loop 510. In particular, in this embodiment, the safety valve 70 is a pressure relief valve (PRV) that is actuated based on a pressure of the cooling liquid flowing in the first loop 510. Notably, in response to the pressure in the cooling liquid flowing in the first loop 510 being greater than a predetermined pressure threshold, the safety valve 70 is actuated to its open position, corresponding to the relief line 60 switching from the closed state to the open state. For instance, in this example, the predetermined pressure threshold is approximately 3 bars (+/−0.5 bars). It is contemplated that the predetermined pressure threshold could be different in other embodiments. Once the pressure of the cooling liquid in the first loop 510 reaches the predetermined pressure threshold, the safety valve 70 is opened and the cooling liquid thus flows from the first loop 510 to the second loop 540, thereby relieving the excessive pressure (i.e., the pressure greater than the predetermined pressure threshold) within the cooling liquid in the first loop 510. Upon the cooling liquid in the first loop 510 reaching a pressure that is less than the predetermined pressure threshold, the safety valve 70 is actuated back to its closed position and therefore prevents the cooling liquid in the first loop 510 from flowing into the second loop 540 through the primary relief line 60.

It is contemplated that the safety valve 70 could be a check valve in other embodiments. In some embodiments, another valve 65 such as a check valve could be added on the primary relief line 60 in addition to the safety valve 70 to ensure that the cooling liquid circulates in one direction. For example, the check valve could be a spring check valve or a joint check valve.

Since the second loop 540 is relatively large in comparison with the first loop 510, the flow of overpressurized cooling liquid from the first loop 510 to the second loop 540 via the primary relief line 60 does not significantly affect the performance of the second loop 540.

Furthermore, in some embodiments, the safety valve 70 could be additionally or alternatively actuated based on the temperature of the cooling liquid in the first loop 510. Notably, in such embodiments, in response to the temperature in the cooling liquid flowing in the first loop 510 being greater than a predetermined temperature threshold, the safety valve 70 is actuated to its open position, thereby placing the primary relief line 60 in the open state. For instance, the predetermined temperature threshold could be between 70° C. and 80° C.

It is contemplated that, in some embodiments, the safety valve 70 could be a solenoid valve that is actuated by a sensor. In other embodiments, the additional valve 65 on the primary relief line 60 could be a solenoid valve.

As will be appreciated from the above, the primary relief line 60 ensures that the cooling liquid flowing within the first loop 510 does not operate at a pressure and/or temperature that is excessive and that could cause a decrease in performance of the first loop 510 and/or damage to components serviced thereby (e.g., excessive heat at the heat-generating electronic component 252). Moreover, since the primary relief line 60 routes the cooling liquid from the first loop 510 to the second loop 540 rather than discharging the cooling liquid externally from the rack 10 (e.g., to a discharge vessel external to the rack 10), this is achieved without having to install a significant amount of piping as might otherwise be the case in a large data center in which various server racks are hosted. Furthermore, the resulting rack 10 is relatively autonomous and does not rely on a significant amount of external infrastructure for its cooling. In addition, the coupling module 1000 is relatively compact and can be rapidly installed on the server rack 10.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for cooling of a rack hosting at least one electronic device, the cooling arrangement comprising:
   a first loop comprising:
      at least one liquid cooling unit thermally coupled to a heat-generating component of the at least one electronic device for cooling thereof, the at least one liquid cooling unit defining a liquid channel adapted to receive a cooling liquid for transferring heat from the heat-generating component to the cooling liquid flowing in the liquid channel,
      a primary side of a liquid-to-liquid heat exchanger, the primary side being fluidly connected to the liquid channel of the at least one liquid cooling unit, and
      a pump fluidly connected between the primary side of the liquid-to-liquid heat exchanger and the at least one liquid cooling unit, the pump being adapted for causing the cooling liquid to flow within the first loop;
   a second loop comprising:
      a secondary side of the liquid-to-liquid heat exchanger, the secondary side being thermally coupled to the primary side to transfer heat from the primary side to the secondary side in response to a temperature of the primary side being greater than a temperature of the secondary side; and
   a relief line selectively fluidly connecting the first loop to the second loop, the relief line being operable in: (i) a closed state whereby the relief line does not allow cooling liquid flow therethrough between the first loop and the second loop, and (ii) an open state whereby the relief line fluidly connects the first loop to the second loop to allow the cooling liquid from the first loop to flow into the second loop, the relief line switching between the closed state and the open state based on at least one operational parameter of the cooling liquid flowing in the first loop.

2. The cooling arrangement of claim 1, wherein the at least one operational parameter includes at least one of a pressure and a temperature of the cooling liquid flowing in the first loop.

3. The cooling arrangement of claim 2, wherein:
the at least one operational parameter includes the pressure of the cooling liquid flowing in the first loop; and
the relief line switches from the closed state to the open state in response to the pressure being greater than a predetermined pressure threshold.

4. The cooling arrangement of claim 2, wherein:
the at least one operational parameter includes the temperature of the cooling liquid contained in the first loop; and
the relief line switches from the closed state to the open state in response to the temperature being greater than a predetermined temperature threshold.

5. The cooling arrangement of claim 1, wherein the relief line comprises a safety valve configured to open and close based on the at least one operational parameter.

6. The cooling arrangement of claim 1, wherein the relief line further comprises a solenoid valve.

7. The cooling arrangement of claim 1, wherein the relief line fluidly connects an inlet of the primary side of the liquid-to-liquid heat exchanger to an inlet or outlet of the secondary side of the liquid-to-liquid heat exchanger.

8. The cooling arrangement of claim 1, further comprising a secondary relief line fluidly connected to the first loop, the secondary relief line comprising an expansion valve or tank for regulating a temperature of the cooling liquid contained in the first loop.

9. The cooling arrangement of claim 1, further comprising a feed line that fluidly connects the first loop to a cooling liquid source in order to allow cooling liquid to flow from the cooling liquid source to the first loop.

10. The cooling arrangement of claim 9, wherein the feed line comprises a non-return valve configured for preventing cooling liquid from the first loop from flowing back in the second loop.

11. The cooling arrangement of claim 9, wherein the feed line comprises one of a solenoid valve and a pressure regulating valve.

12. The cooling arrangement of claim 9, wherein the cooling liquid source is the second loop such that the feed line fluidly connects the first loop to the second loop.

13. The cooling arrangement of claim 12, wherein the feed line comprises a filter for filtering the cooling liquid incoming from the second loop.

14. The cooling arrangement of claim 9, wherein the feed line fluidly connects an inlet of the primary side of the liquid-to-liquid heat exchanger to an inlet of the secondary side of the liquid-to-liquid heat exchanger.

15. A rack comprising:
a frame defining a housing section for receiving at least one electronic device;
at least one fan configured for providing forced air cooling to the at least one electronic device; and
the cooling arrangement of claim 1 for cooling of the at least one electronic device.

* * * * *